United States Patent
Sakamoto et al.

(10) Patent No.: US 10,607,918 B2
(45) Date of Patent: Mar. 31, 2020

(54) PHASE-CHANGE COOLER AND PHASE-CHANGE COOLING METHOD

(71) Applicant: NEC Corporation, Tokyo (JP)

(72) Inventors: Hitoshi Sakamoto, Tokyo (JP); Minoru Yoshikawa, Tokyo (JP); Mahiro Hachiya, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 15/128,354

(22) PCT Filed: Mar. 20, 2015

(86) PCT No.: PCT/JP2015/001586
§ 371 (c)(1),
(2) Date: Sep. 22, 2016

(87) PCT Pub. No.: WO2015/146110
PCT Pub. Date: Oct. 1, 2015

(65) Prior Publication Data
US 2017/0125323 A1    May 4, 2017

(30) Foreign Application Priority Data
Mar. 26, 2014    (JP) .................... 2014-063622

(51) Int. Cl.
*H01L 23/427*    (2006.01)
*H01L 23/40*    (2006.01)
(Continued)

(52) U.S. Cl.
CPC ........ *H01L 23/427* (2013.01); *F28D 15/0266* (2013.01); *H01L 23/4006* (2013.01);
(Continued)

(58) Field of Classification Search
CPC ............... H01L 23/427; H01L 23/4006; H01L 2023/4056; H01L 2023/4062;
(Continued)

(56) References Cited

U.S. PATENT DOCUMENTS 5,343,358 A *  8/1994  Hilbrink ................ H05K 7/208
165/104.33
8,016,024 B2 *  9/2011  Kang .................. F28D 15/0266
165/104.21
(Continued)

FOREIGN PATENT DOCUMENTS

EP         2801780 A1    11/2014
JP      H08-250632 A     9/1996
(Continued)

OTHER PUBLICATIONS

International Search Report corresponding to PCT/JP2015/001586 dated May 19, 2015 (5 pages).
(Continued)

*Primary Examiner* — Justin M Jonaitis
(74) *Attorney, Agent, or Firm* — Wilmer Cutler Pickering Hale and Dorr LLP

(57) ABSTRACT

A cooler grows in size and its structure becomes complicated in a phase-change cooler if it is intended to cool a plurality of heating elements; therefore, a phase-change cooler according to an exemplary aspect of the present invention includes a heat-conducting board configured to be thermally connected to a cooling object; heat receiving means for storing a refrigerant and receiving heat of the cooling object through the heat-conducting board; radiation means for radiating heat, condensing and devolatilizing a vapor-phase refrigerant arising from vaporization of the
(Continued)

refrigerant in the heat receiving means; and connection means for connecting the heat receiving means and the radiation means.

16 Claims, 14 Drawing Sheets

(51) Int. Cl.
*F28D 15/02* (2006.01)
*H05K 7/20* (2006.01)

(52) U.S. Cl.
CPC .. *H05K 7/20318* (2013.01); *H01L 2023/4056* (2013.01); *H01L 2023/4062* (2013.01); *H01L 2023/4068* (2013.01); *H01L 2924/0002* (2013.01)

(58) Field of Classification Search
CPC ........ H01L 2023/4068; H05K 7/20318; F28D 15/04; F28D 15/043; F28D 15/046; F28D 2015/0216; F28D 15/02; F28D 15/0266; F28D 2021/007
USPC ................. 165/104.21, 104.26, 104.33, 80.4
See application file for complete search history.

(56) References Cited

U.S. PATENT DOCUMENTS

| | | | | |
|---|---|---|---|---|
| 2002/0038550 | A1* | 4/2002 | Gillen | F25B 21/04 62/3.7 |
| 2005/0201061 | A1* | 9/2005 | Nikfar | F28D 15/0233 361/700 |
| 2006/0283577 | A1* | 12/2006 | Liu | F28D 15/043 165/104.26 |
| 2007/0242438 | A1* | 10/2007 | Belits | F28D 15/0266 361/700 |
| 2008/0007917 | A1 | 1/2008 | Kao | |
| 2008/0277099 | A1* | 11/2008 | Takamatsu | F28D 15/043 165/104.26 |
| 2011/0192574 | A1* | 8/2011 | Yoshikawa | F28D 15/0266 165/104.21 |
| 2013/0319639 | A1* | 12/2013 | Sakamoto | F28D 15/0266 165/104.29 |
| 2014/0165638 | A1* | 6/2014 | Yoshikawa | F28D 15/0266 62/259.2 |
| 2014/0331709 | A1 | 11/2014 | Chiba et al. | |

FOREIGN PATENT DOCUMENTS

| | | |
|---|---|---|
| JP | H0923081 A | 1/1997 |
| JP | H09129820 A | 5/1997 |
| JP | 2000-183259 A | 6/2000 |
| JP | 2005-086019 A | 3/2005 |
| JP | 3134452 U | 8/2007 |
| JP | 2009-193463 A | 8/2009 |
| JP | 2011-047616 A | 3/2011 |
| JP | 2011-223019 A | 11/2011 |
| JP | 2012-242952 A | 12/2012 |
| WO | WO-2013-018667 A1 | 3/2015 |

OTHER PUBLICATIONS

Extended European Search Report issued by the European Patent Office for European Application No. 15770269.7 dated Dec. 1, 2017 (7 pages).
Notification of Reasons for Refusal issued by the Japanese Patent Office for Japanese Application No. 2016-510014 dated Aug. 21, 2018 (12 pages).
Japanese Office Action issued in Japanese Patent Application No. 2016-510014, dated Jan. 8, 2019, 9 pages.

* cited by examiner

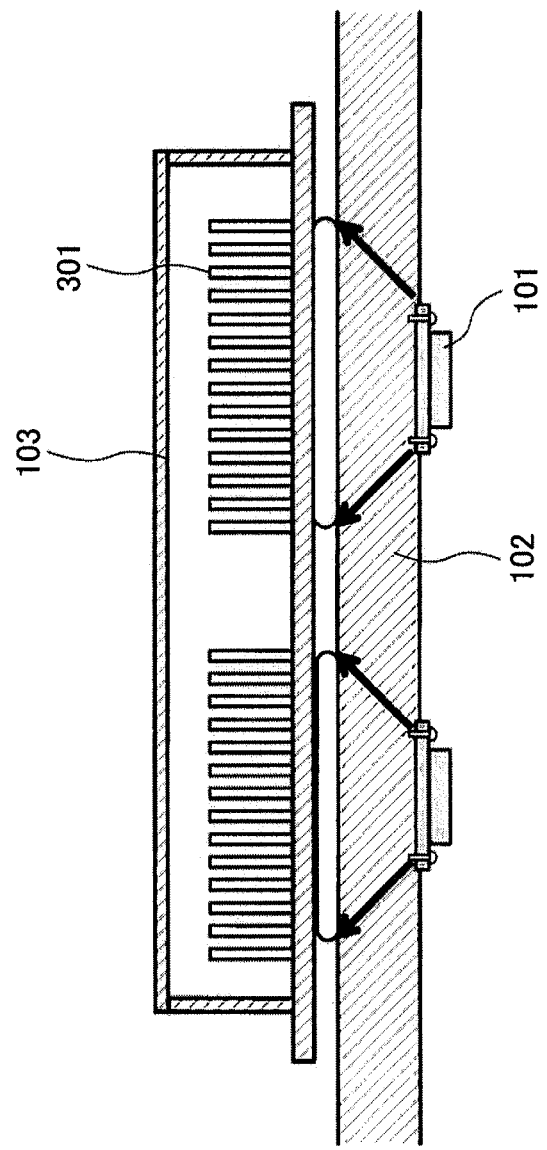

PHASE-CHANGE COOLER AND PHASE-CHANGE COOLING METHOD

CROSS-REFERENCE TO RELATED APPLICATIONS

This application is a national stage application of International Application No. PCT/JP2015/001586 entitled "PHASE-CHANGE COOLER AND PHASE-CHANGE COOLING METHOD" filed on Mar. 20, 2015, which claims priority to Japanese Application No. 2014-063622 filed on Mar. 26, 2014, the disclosures of which are hereby incorporated by reference in their entirety.

TECHNICAL FIELD

The present invention relates to coolers and cooling methods for semiconductor devices, electronic equipment, and the like, in particular, to a phase-change cooler and a phase-change cooling method employing a phase-change system in which heat transport and heat radiation are performed by a cycle of vaporization and condensation of a refrigerant.

BACKGROUND ART

In order to transport a large amount of heat generated in a semiconductor device and electronic equipment, a cooling method has been developed by which to achieve higher cooling performance by disposing a heat receiving unit outside the semiconductor device or the like and making a refrigerant flow inside the heat receiving unit. In particular, a cooling method based on a phase-change system has been developed by which a higher cooling effect can be obtained by boiling a liquid-phase refrigerant in a heat receiving unit.

In general, it is necessary to circulate a refrigerant between a heat receiving unit and a radiation unit in order to release heat drawn by a refrigerant to the outside. This makes a pump normally used. In contrast, it makes a pump unnecessary in a cooler using the phase-change system (hereinafter referred to as "a phase-change cooler") to dispose a heat receiving unit in the lower part of the cooler and a radiation unit in the upper part of the cooler. Such a cooling structure employing the phase-change system utilizes the principle that the vapor-phase refrigerant accumulates upward in a vertical direction due to a density difference between a vapor-phase refrigerant and a liquid-phase refrigerant that arise.

An example of such a phase-change cooler is described in Patent Literature 1. An ebullient cooling device described in Patent Literature 1 includes a refrigerant tank to pool a refrigerant that boils by receiving heat from a heating element, and a radiation unit to liquefy the refrigerant vapor boiled in the refrigerant tank by a heat exchange with an external fluid. The refrigerant tank includes a vapor path through which the refrigerant vapor flows from a boiling space formed inside a heat-receiving surface to the radiation unit, and a liquid return path to return a condensed liquid liquefied in the radiation unit to the boiling space. It is configured to dispose recessively a surface close to the heating element of a lateral surface of the vapor path and a surface close to the heating element of a lateral surface of the liquid return path, on the side opposite to the heating element with respect to the heat-receiving surface.

If electronic equipment includes an element that is a vital portion of power consumption, the above-mentioned cooler is particularly effective in order to cool the element. If there are a plurality of heating elements, however, a plurality of those coolers are required.

An example of an electronic device using a plurality of coolers is described in Patent Literature 2. The electronic device described in Patent Literature 2 is configured to dispose a cooling system utilizing a thermosiphon for a plurality of central processing units (CPUs) of heat sources. Specifically, the condensers composing the cooling system are disposed aligning along a path of the air (the cooling wind) supplied from the outside by means of cooling fans.

The above-mentioned electronic device utilizes the cooling fans that are cooling means of other devices installed within a housing as the cooling means (the radiators) of the condensers composing the cooling system utilizing a thermosiphon. This makes it possible, they say, to cool down the CPUs as heat sources in the housing efficiently and certainly, without providing cooling fans for exclusive use, by the cooling system relatively simple and cheap, requiring no motive power of a pump to drive a liquid, and superior in the energy saving.

The related arts include the technologies described in Patent Literature 3 and Patent Literature 4.

CITATION LIST

Patent Literature

[PTL 1] Japanese Unexamined Patent Application Publication No. 2000-183259

[PTL 2] Japanese Unexamined Patent Application Publication No. 2011-047616

[PTL 3] Japanese Unexamined Patent Application Publication No. 2009-193463

[PTL 4] Japanese Unexamined Patent Application Publication No. 2011-223019

SUMMARY OF INVENTION

Technical Problem

The related phase-change cooler as mentioned above has high heat-transfer efficiency, which enable the cooler to be miniaturized. However, if a small heating element having a high heating value is cooled, there has been the problem that a heat receiving unit grows in size even though the heat receiving unit is configured to be separated from a radiation unit.

In cooling a plurality of heating elements, if a plurality of condensers are configured to be lined up side by side as with the cooler described in Patent Literature 2, a transverse layout space is required. Accordingly, there has been the problem that a transverse layout space is required as a heating value per heating element becomes larger. On the other hand, if it is intended to cool a plurality of heating elements using a single phase-change cooler, there is the problem that the structure of the cooler is complicated because a flow of a refrigerant inside a heat receiving unit not only increases but also becomes complicated.

Thus, there is the problem that the cooler grows in size and its structure becomes complicated in the related phase-change cooler if it is intended to cool a plurality of heating elements.

The object of the present invention is to provide a phase-change cooler and a phase-change cooling method which solve the above-mentioned problem that a cooler grows in size and its structure becomes complicated in a phase-change cooler if it is intended to cool a plurality of heating elements.

Solution to Problem

A phase-change cooler according to an exemplary aspect of the present invention includes a heat-conducting board configured to be thermally connected to a cooling object; heat receiving means for storing a refrigerant and receiving heat of the cooling object through the heat-conducting board; radiation means for radiating heat, condensing and devolatilizing a vapor-phase refrigerant arising from vaporization of the refrigerant in the heat receiving means; and connection means for connecting the heat receiving means and the radiation means.

A phase-change cooling method according to an exemplary aspect of the present invention includes receiving heat of a cooling object; diffusing the heat and then transferring the heat to a refrigerant; and radiating heat, condensing and devolatilizing a vapor-phase refrigerant arising from vaporization of the refrigerant.

Advantageous Effects of Invention

According to the phase-change cooler and the phase-change cooling method of the present invention, it is possible to obtain a small phase-change cooler that has a simplified configuration and is capable of cooling a plurality of heating elements.

BRIEF DESCRIPTION OF DRAWINGS

FIG. 7B is a cross-sectional view illustrating another configuration near to the heat receiving unit in the phase-change cooler in accordance with the third exemplary embodiment of the present invention.

DESCRIPTION OF EMBODIMENTS

Exemplary embodiments of the present invention will be described with reference to the drawings below.

A First Exemplary Embodiment

Figure 1:
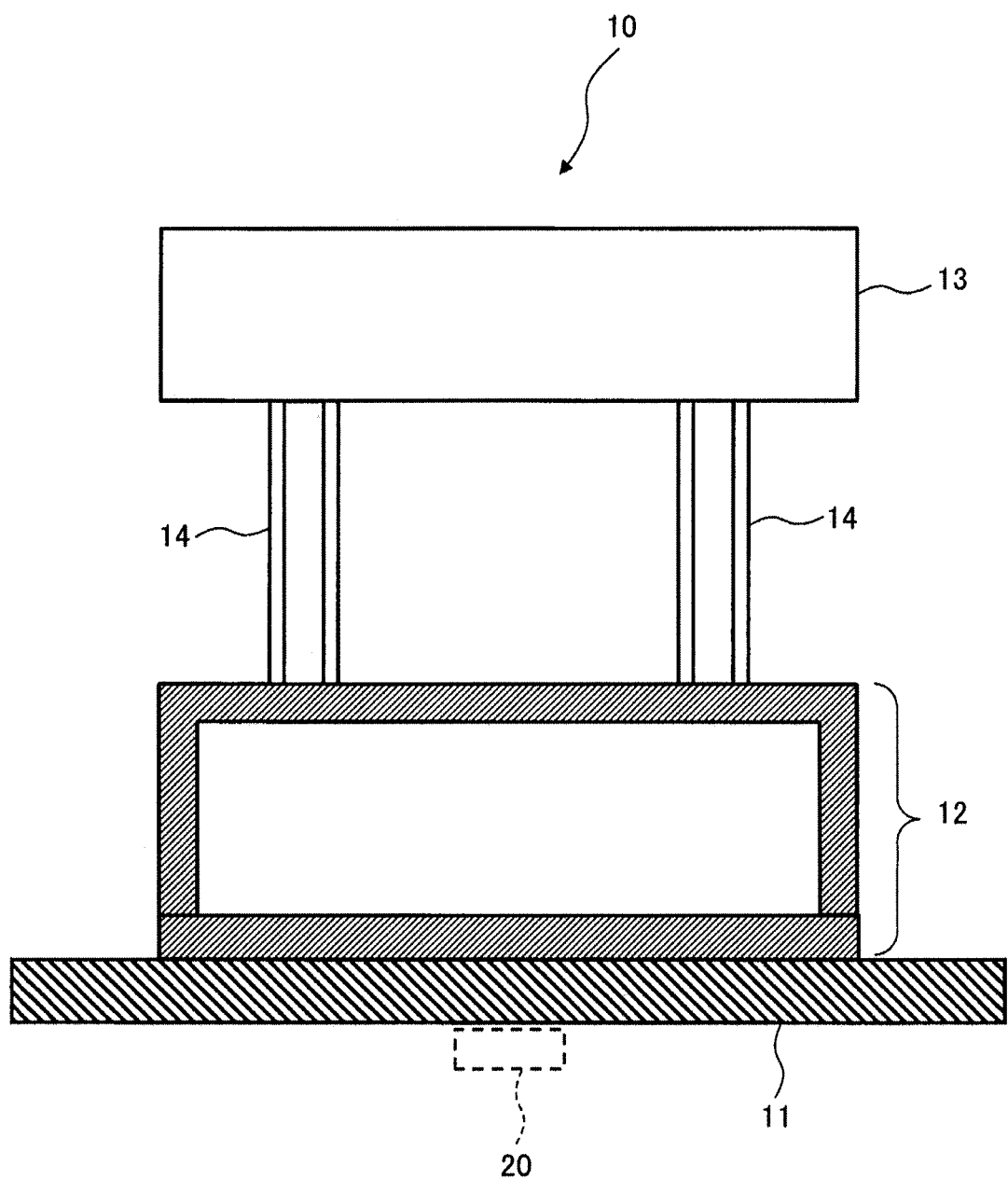
FIG. 1 is a cross-sectional view illustrating a configuration of a phase-change cooler in accordance with a first exemplary embodiment of the present invention.

FIG. 1 is a cross-sectional view illustrating a configuration of a phase-change cooler 10 in accordance with a first exemplary embodiment of the present invention. The phase-change cooler 10 in accordance with the present exemplary embodiment includes a heat-conducting board 11 to be thermally connected to a cooling object 20, a heat receiving unit 12, a radiation unit 13, and a connection 14 to connect the heat receiving unit 12 and the radiation unit 13.

The heat receiving unit 12 stores a refrigerant and receives heat of the cooling object 20 through the heat-conducting board 11. The radiation unit 13 radiates heat, condenses and devolatilizes a vapor-phase refrigerant arising from vaporization of the refrigerant in the heat receiving unit 12.

Next, the operation of the phase-change cooler 10 in accordance with the present exemplary embodiment will be described. High-density heat, from a heating element with a small-area as an example of the cooling object 20, transfers to the heat-conducting board (heat-conducting plate) 11 thermally connected to the heating element, propagates in a thickness direction diffusing and spreading, and reaches to the heat receiving unit. Since the heating element and the heat receiving unit 12 are disposed with the heat-conducting board (heat-conducting plate) 11 between them, the heat of the heating element diffuses and then transfers to the heat receiving unit 12. The refrigerant stored in the heat receiving unit 12 vaporizes using the heat as vaporization heat, turns to large quantities of vapor-phase refrigerant, and reaches to the radiation unit 13 through the connection 14. The vapor-phase refrigerant condenses and devolatilizes in the radiation unit 13, and radiates heat. The liquid-phase refrigerant that has been condensed and devolatilized flows back to the heat receiving unit 12 through the connection 14. The phase-change cooler 10 is capable of cooling the cooling object 20 by such a circulation of the refrigerant without using a drive part such as a pump.

As mentioned above, according to the phase-change cooler 10 of the present exemplary embodiment, it is possible to diffuse the heat from the cooling object 20 such as a heating element in the heat-conducting board 11 and transfer the heat to the refrigerant stored in the heat receiving unit 12. Accordingly, it is possible to transfer the heat efficiently to the refrigerant stored in the heat receiving unit 12 even though the heat is received from a plurality of heating elements. As a result, according to the phase-change cooler 10 of the present exemplary embodiment, it is possible to obtain a small phase-change cooler that has a simplified configuration and is capable of cooling a plurality of heating elements.

Next, a phase-change cooling method according to the present exemplary embodiment will be described. In the phase-change cooling method according to the present exemplary embodiment, first, the heat of a cooling object is received, and the heat is diffused. Subsequently, the heat is transferred to a refrigerant. At this time, a vapor-phase refrigerant arising from vaporization of the refrigerant is condensed and devolatilized, and the heat is radiated. According to the phase-change cooling method of the present exemplary embodiment, it is possible to transfer the heat efficiently to a refrigerant even though the heat is received from a plurality of heating elements because the heat of a cooling object is transferred to a refrigerant after diffusing the heat. As a result, it is possible to cool a plurality of heating elements efficiently.

A Second Exemplary Embodiment

Figure 2:
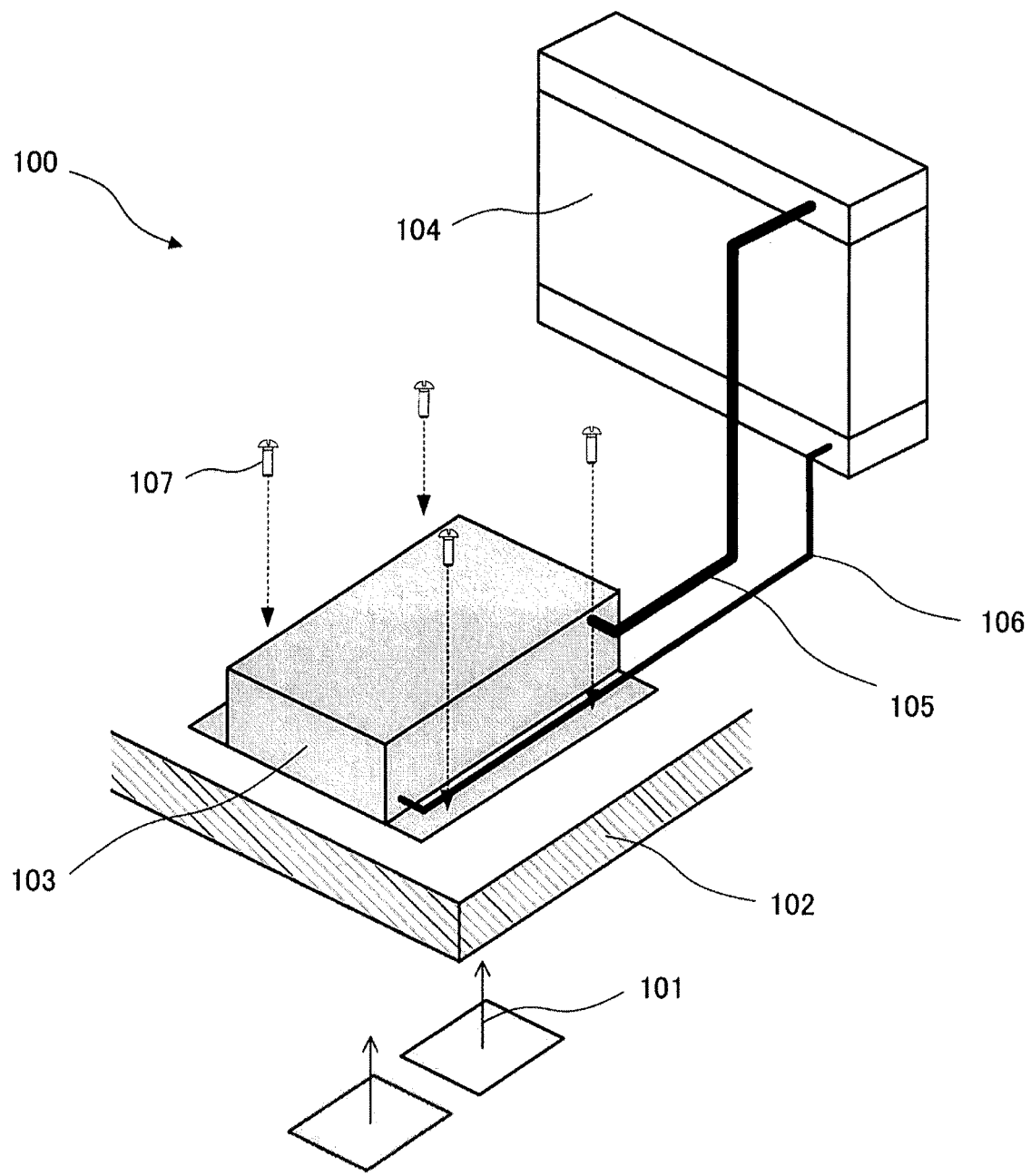
FIG. 2 is a perspective view illustrating a mounting process of a phase-change cooler in accordance with a second exemplary embodiment of the present invention.
Figure 3:
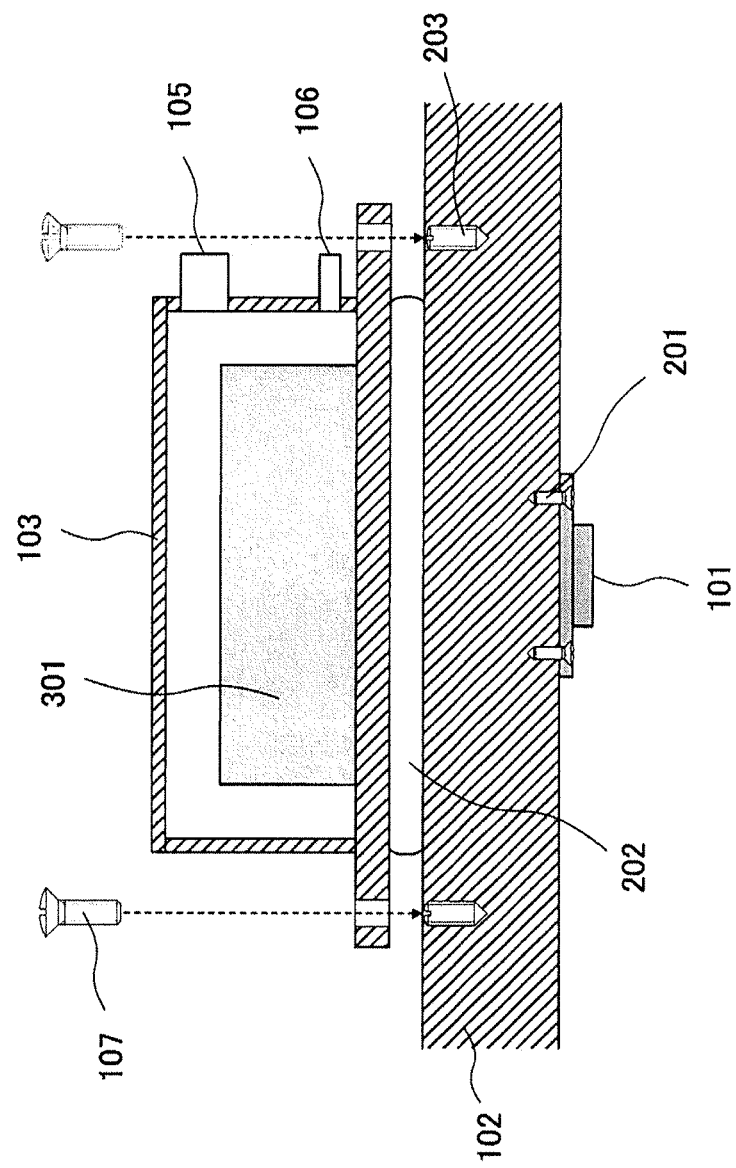
FIG. 3 is a cross-sectional view illustrating a configuration near to a heat receiving unit of the phase-change cooler in accordance with the second exemplary embodiment of the present invention.

Next, a second exemplary embodiment of the present invention will be described. FIG. 2 is a perspective view illustrating a mounting process of a phase-change cooler 100 in accordance with the second exemplary embodiment of the present invention. FIG. 3 is a cross-sectional view illustrating a configuration near to a heat receiving unit of the phase-change cooler 100 in accordance with the second exemplary embodiment of the present invention.

Electronic devices, such as a central processing unit (CPU) and a field effect transistor (FET) in which heat is generated concentrically, are mounted in electronic equipment. Such electronic devices will be described as an example of a cooling object in the following exemplary embodiments.

A heating element 101 that is small and has a high heating value such as an electronic device is fixed to a heat-conducting plate 102 as a heat-conducting board through a fixing member 201 or the like. A heat receiving unit 103 composing the phase-change cooler 100 is disposed on the opposite side of a surface on which the heating element 101 is placed among the surfaces of the heat-conducting plate 102. The heat receiving unit 103 is fixed to the heat-conducting plate 102 using a fixing member 107 such as a screw.

The heat-conducting plate 102 propagates the heat from the heating element 101 in a thickness direction diffusing the heat in an in-plane direction and transfers the heat to the heat receiving unit 103. The heat-conducting plate 102 can be no fewer than about three millimeters, nor more than about ten millimeters in thickness, as an example.

It is preferable to dispose a heat-conducting member 202 that conducts heat efficiently on a contact surface between the heating element 101 and the heat-conducting plate 102 and a contact surface between the heat-conducting plate 102 and the heat receiving unit 103, respectively. Highly heat-conductive materials can be used as the heat-conducting member 202, such as liquid grease, a solid sheet, a metallic sheet including indium or an indium alloy, and a sheet using graphite, for example.

In the present exemplary embodiment, the heat receiving unit 103 is configured to be fixed to the heat-conducting plate 102 by means of a screw as the fixing member 107 and an internal thread 203 on the heat-conducting plate 102. In this case, it is preferable to press the heat receiving unit 103 against the heat-conducting plate 102 by the pressure ranging from approximately 100 kilopascals (kPa) to 500 kilopascals (kPa) in order to stay connected thermally. The reason is that the press enables the heat receiving unit 103 to adhere tightly to the heat-conducting plate 102 and enables the thermal resistance to decrease that is resistance to heat transferring from the heat-conducting plate 102 to the heat receiving unit 103.

The heat receiving unit 103 is connected to the radiation unit 104 by a vapor pipe 105 as a first connection and a liquid pipe 106 as a second connection. The vapor pipe 105 transports a refrigerant vapor from the heat receiving unit 103 to the radiation unit 104. The liquid pipe 106 transports the liquid-phase refrigerant condensed and devolatilized in the radiation unit 104 from the radiation unit 104 to the heat receiving unit 103. That is to say, the refrigerant vapor arising in the heat receiving unit 103 travels to the radiation unit 104 through the vapor pipe 105. The liquid-phase refrigerant that is back to a liquid phase by radiating heat in the radiation unit 104 flows back to the heat receiving unit 103 through the liquid pipe 106.

The heat receiving unit 103 includes a container such as a hollow chamber made of highly heat-conductive metals such as copper and aluminum. The container includes on the side a vapor outlet as a first junction connected to the vapor pipe 105 and a liquid inlet as a second junction connected to the liquid pipe 106. The heat receiving unit 103 can be configured to include a plurality of projection portions, each of which is a fin 301, for example, which are disposed on a heat receiving unit bottom surface of a bottom surface in an interior wall of the container in contact with the refrigerant. The fin 301 enables the heat-transfer performance to the refrigerant to improve. Additionally, it is allowed to form a flow path to control a stream of the liquid-phase refrigerant or the vapor-phase refrigerant.

The inner surface of a chamber composing the heat receiving unit 103 may be roughened by sandblasting or the like at the level ranging from several tens of micrometers (μm) to 100 micrometers (μm). The reason is that this increase the number of nuclei where refrigerant bubbles arise. The generation of more bubbles facilitates the transfer of heat from the inner surface of the chamber, which results in further improvement in cooling performance.

As mentioned above, according to the phase-change cooler 100 of the present exemplary embodiment, it is possible to diffuse the heat from the heating element 101 in the heat-conducting board 102 and transfer the heat to the refrigerant stored in the heat receiving unit 103. Accordingly, it is possible to transfer the heat efficiently to the refrigerant stored in the heat receiving unit 103 even though the heat is received from a plurality of heating elements. As a result, according to the phase-change cooler 100 of the present exemplary embodiment, it is possible to obtain a small phase-change cooler that has a simplified configuration and is capable of cooling a plurality of heating elements.

A Third Exemplary Embodiment

Figure 4:
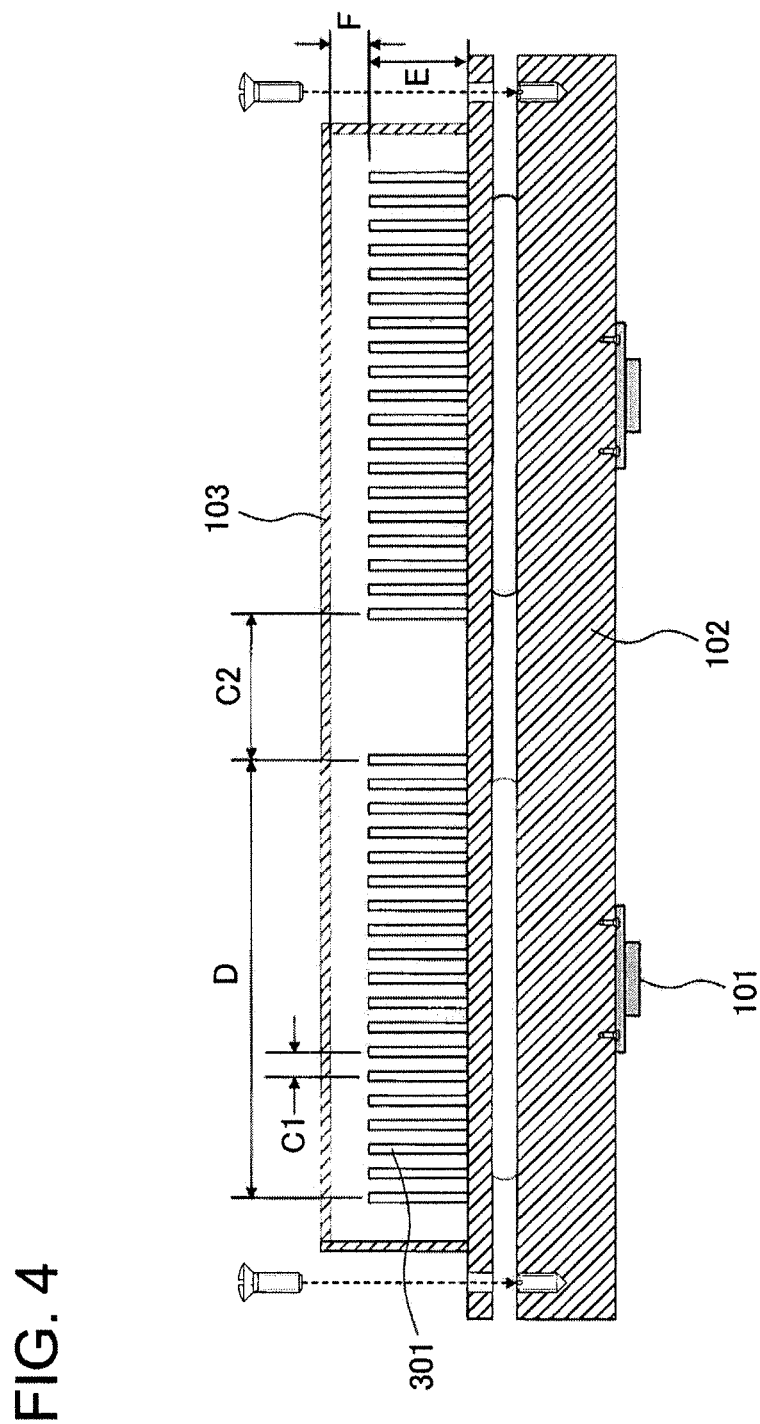
FIG. 4 is a cross-sectional view illustrating a configuration near to a heat receiving unit in a phase-change cooler in accordance with a third exemplary embodiment of the present invention.

Next, a third exemplary embodiment of the present invention will be described. FIG. 4 is a cross-sectional view illustrating a configuration near to a heat receiving unit 103 in a phase-change cooler in accordance with the third exemplary embodiment of the present invention. FIG. 4 illustrates a configuration in which two heating elements 101 are mounted.

The heat from the heating element 101 disposed on a surface of a heat-conducting plate 102 transfers to the heat receiving unit 103 composing the phase-change cooler through the heat-conducting plate 102. The heat propagates to a refrigerant through a fin 301 as a projection portion within the heat receiving unit 103. Receiving the heat, the refrigerant boils and vaporizes. The liquid-phase refrigerant and generated refrigerant bubbles flow smoothly if an interval C1 between the respective fins 301 is wide; however, a decrease in vaporization efficiency of the refrigerant results in reduced cooling efficiency due to a decrease in the number of the fins 301 if the interval is too wide. Accordingly, it is preferable that the interval C1 between the fins 301 ranges roughly from 0.5 millimeter (mm) to a few millimeters (mm).

As illustrated in FIG. 4, in the present exemplary embodiment, a plurality of fins (projection portions) 301 are disposed in a fin region (projection region) approximately centered at the position facing the heating element 101 on the bottom surface of the heat receiving unit 103. That is to say, in the case of FIG. 4, a fin region is formed for each of the two heating elements. It is preferable to create a space C2 between the fin regions so as not to block the flow of the refrigerant; however, the same does not apply in cases where the heating element 101 has a low heating value. The space C2 between the fin regions can be set at a value ranging from the interval C1 between the fins 301 to a total length D of the fin region depending on the heating value of the heating element 101. That is to say, the plurality of fins (projection portions) 301 can be disposed in a plurality of fin regions (projection regions), and the distance between the plurality of fin regions (projection regions) can be equal to or larger than the distance between the plurality of fins (projection portions) 301.

The total length D of the fin region is determined based on a heat radiation area required to radiate the heat from the heating element 101 and typically ranges from approximately 20 millimeters (mm) to 50 millimeters (mm). Similarly, the height of the fin E is determined based on a length required to ensure a heat radiation area. If the height is too long, a vaporization efficiency of the refrigerant decreases due to the influence of a fall in temperature owing to the heat conduction in the fin. Accordingly, the height of the fin E typically ranges from approximately five millimeters (mm) to 20 millimeters (mm).

A space F is also created between the upper end of the fin 301 and the upper surface of a container composing the heat receiving unit 103, which enables a generated refrigerant vapor to flow smoothly toward the vapor pipe 105. The distance of the space F can be set ranging from approximately twice the interval C1 between the fins to approximately twice the fin height E. If the distance of the space F is equal to or shorter than approximately five millimeters (mm), the pressure in the heat receiving unit 103 increases because it becomes difficult for the generated refrigerant vapor to flow smoothly from the heat receiving unit 103 toward the radiation unit 104. If the pressure inside the heat receiving unit 103 increases, this becomes a factor in a decrease in cooling performance because it becomes difficult for the liquid-phase refrigerant to vaporize. If it is difficult for the refrigerant vapor to flow, the cooling performance decreases because the heat is prevented from transferring. However, even though the distance of the space F is set at 20 millimeters (mm) or longer, the fluidity of the refrigerant vapor and the effect of suppressing an increase in pressure inside the heat receiving unit are not much improved.

With regard to a connecting location of the vapor pipe 105, it is preferable to dispose the connecting location between the upper end of the fin 301 and the upper surface of the container composing the heat receiving unit 103, as illustrated in FIG. 3. Because the refrigerant vapor arising from between the respective fins gathers in this region, it is possible to exhaust the refrigerant vapor efficiently from the heat receiving unit 103 by disposing the vapor pipe 105 in the region. In addition, since the vapor pipe 105 does not project from the upper part of the heat receiving unit 103, the phase-change cooler can be miniaturized.

Figure 5:
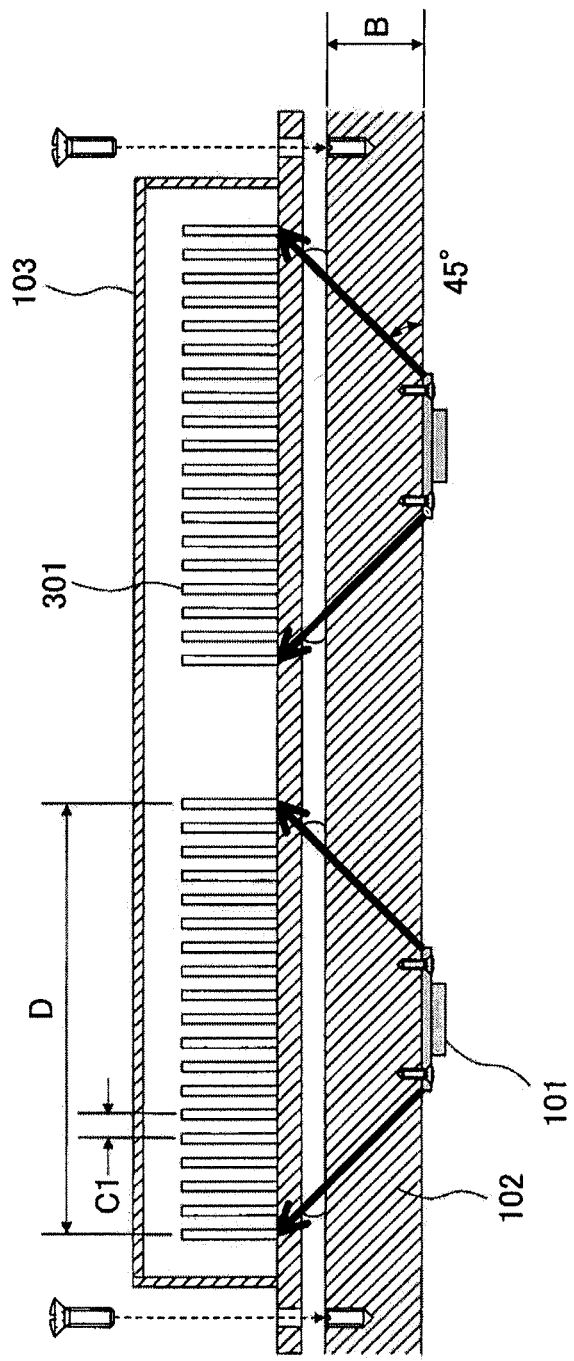
FIG. 5 is a cross-sectional view illustrating a configuration of a fin included in a heat receiving unit in the phase-change cooler in accordance with the third exemplary embodiment of the present invention.

In order to efficiently transfer the heat from the heating element 101 to the refrigerant through the fin 301 in the heat receiving unit 103, it is preferable to dispose the fins 301 in the heat receiving unit 103 and the heating element 101 at the location facing each other across the heat-conducting plate 102 so as to make them homocentric. As illustrated in FIG. 5, it is preferable to dispose the fin region (projection region) in the region, through which the center line of the surface of the heating element 101 passes, between two planes making approximately 45 degrees with the normal to the heat-conducting plate 102. That is to say, it is preferable to dispose the heating element 101 in the region defined by planes that pass through the edges of the fins 301 and makes approximately 45 degrees with the normal to the heat-conducting plate 102. The reason is that the vertical diffusion length of the heat becomes equal to the horizontal diffusion length of the heat on the lines at 45 degrees to the surface of the heat-conducting plate 102; therefore, it is preferable to place the fins 301 in the region between these lines.

As mentioned above, the heat-conducting plate 102 has the effect of spreading the heat from the heating element 101 with a smaller area throughout the bottom surface of the heat receiving unit 103. This makes the heat from the heating element 101 propagate with spreading; therefore, it is preferable to place the fins 301 over the area larger than the size of the heating element 101. At this time, the fins 301 may be placed in the region with the same area as the area of the bottom surface of the heat receiving unit 103. The area of the bottom surface of the heat receiving unit 103 and the installation area of the fins 301 may be determined assuming that the heat from the heating element 101 spreads at an angle of 45 degrees to the propagation direction of the heat. Based on this though, the total length D of the fin region may be set, which results in the total length D of the fin region ranging from 20 millimeters (mm) to 50 millimeters (mm) approximately. If the thickness B of the heat-conducting plate 102 is too large, the vaporization efficiency of the refrigerant decreases by influences of fall in temperature due to heat conduction; therefore, it is preferable for the thickness B of the heat-conducting plate 102 to range from three millimeters (mm) to ten millimeters (mm) approximately.

Figure 6:
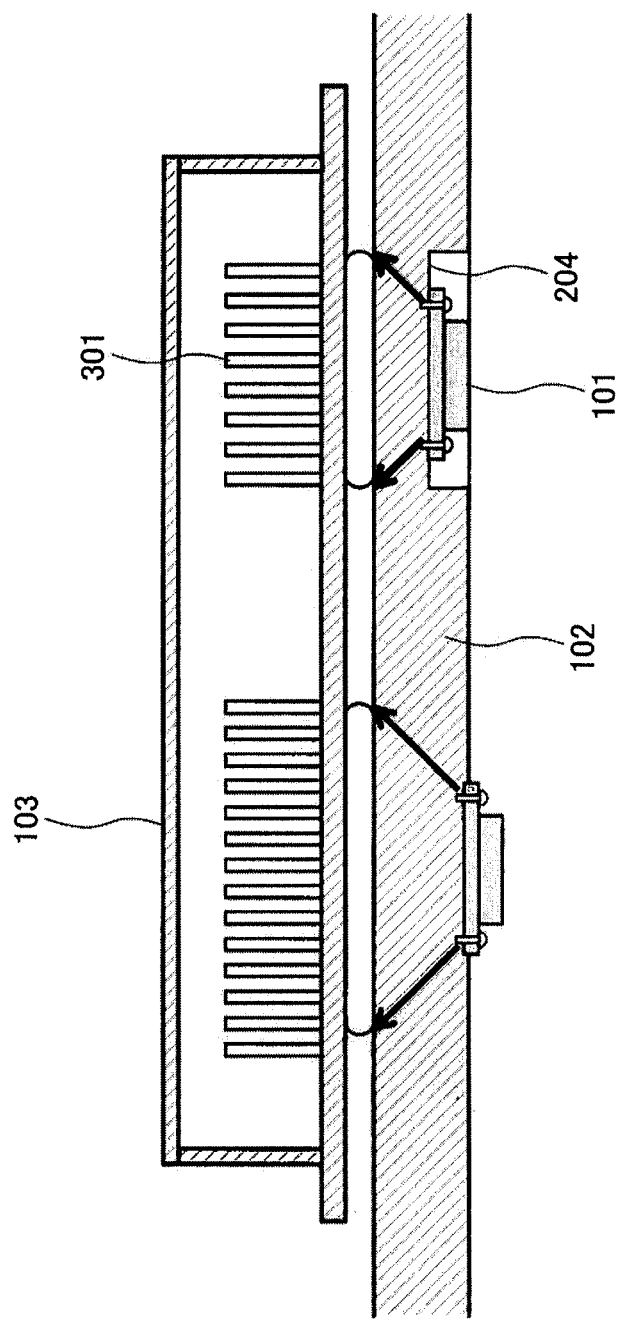
FIG. 6 is a cross-sectional view illustrating another configuration of a heat-conducting plate in the phase-change cooler in accordance with the third exemplary embodiment of the present invention.

As illustrated in FIG. 6, the heat-conducting plate (heat-conducting board) 102 may be configured to include a concave portion 204 corresponding to the shape of a heating element 101 on the surface facing the heating element 101 as a cooling object. That is to say, the heating element 101 can be disposed placing the concave portion 204 in the heat-conducting plate 102. Even though the concave portion 204 is placed, it is preferable to dispose the heating element 101 in the area defined by planes that pass through the edges of the fins 301 included in the heat receiving unit 103 and makes approximately 45 degrees with the normal to the heat-conducting plate 102. If a heating element with a smaller heating value is cooled, it is possible to cool it sufficiently even though the fins 301 included in the heat receiving unit 103 are in small. This makes it unnecessary to diffuse the heat widely in the heat-conducting plate 102; therefore, the concave portion 204 can be placed. Thus, the concave portion 204 enables the effect of thermal diffusion to be optimized depending on the heating value of each heating element 101.

Figure 7A:
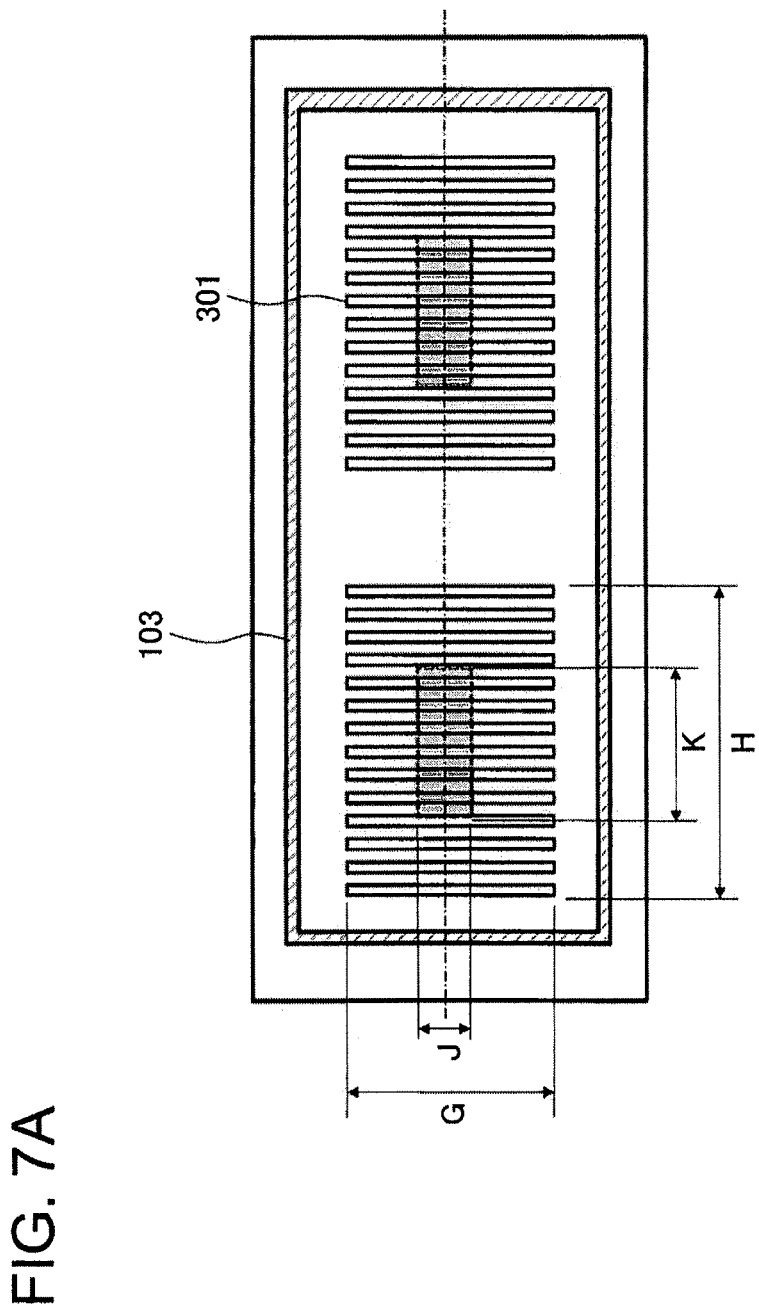
FIG. 7A is a top view illustrating another configuration near to the heat receiving unit in the phase-change cooler in accordance with the third exemplary embodiment of the present invention.

Using FIG. 7A and FIG. 7B, another configuration of arrangement of the fins 301 will be described. FIG. 7A is a top view illustrating a configuration near to the heat receiving unit included in the phase-change cooler in accordance with the present exemplary embodiment, and FIG. 7B is a cross-sectional view.

As illustrated in FIG. 7A, the fin (projection portion) 301 has a plate-like shape extending in one direction, and a plurality of fins are disposed in an array direction approximately perpendicular to the drawing direction of the plate-like shape. Here, the heat-conducting plate (heat-conducting board) 102 is thermally connected to the heating element 101 in the arrangement where the longitudinal direction of the heating element 101 as a cooling object is approximately parallel to the array direction. That is to say, the phase-change cooler in accordance with the present exemplary embodiment can be used, with the heating element 101 being disposed so that the longitudinal direction of the heating element 101 may correspond to the array direction of the fins 301 disposed within the heat receiving unit 103. At this time, the heat from the heating element 101 diffuses in the heat-conducting plate 102, and the heat transferred to the heat receiving unit 103 transfers to the plurality of the fins 301 more uniformly. The configuration makes it possible to use the respective fins 301 efficiently; therefore, it becomes possible to minimize the area and the number of pieces of the fins 301. As a result, a phase-change cooler with a smaller size can be obtained. As illustrated in FIG. 7A, it is preferable for the heating element 101 to be disposed roughly in the center of a surface onto which the fin region is projected in which fin rows are placed, on the bottom surface of the heat receiving unit. It is preferable for a ratio between height G and width H (G/H) of the surface on which the fin rows are placed to be nearly equal to a ratio between height J and width K (J/K) of the heating element 101.

Figure 8:
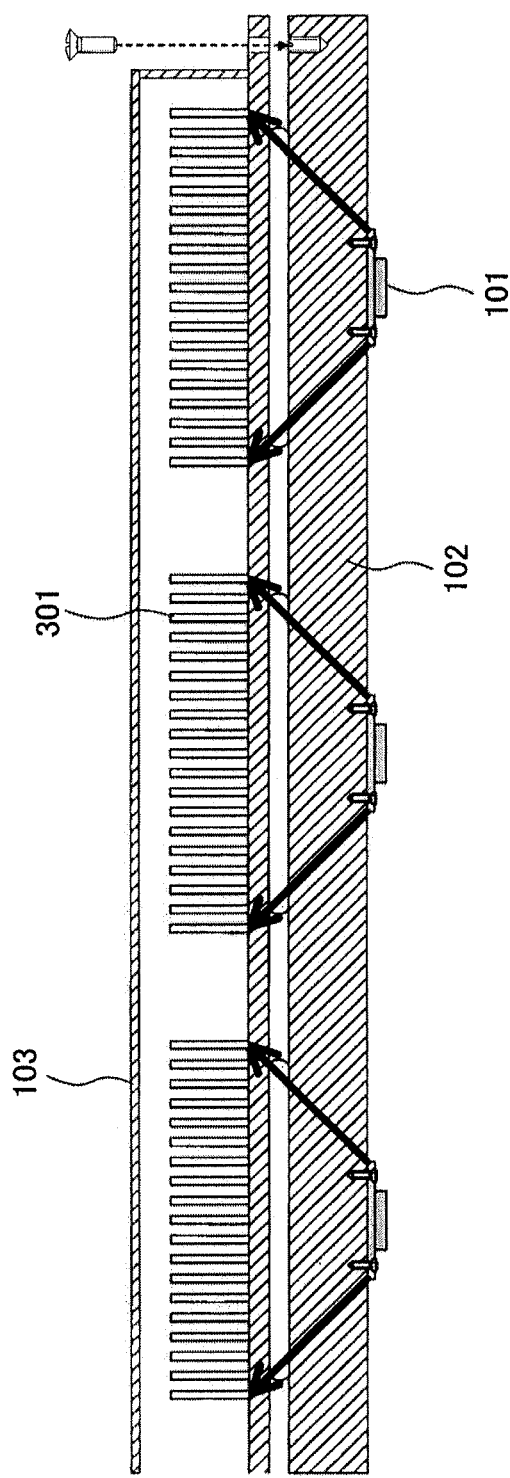
FIG. 8 is a cross-sectional view illustrating yet another configuration near to the heat receiving unit in the phase-change cooler in accordance with the third exemplary embodiment of the present invention.

Although the configuration is used as an example in the description above in which two heating elements 101 are mounted on the phase-change cooler, the number of pieces of the heating elements 101 is not limited to this. As illustrated in FIG. 8, three pieces of the heating elements 101 may be mounted as cooling objects, and the heat receiving unit 103 included in the phase-change cooler to cool the heating elements may be disposed through the heat-conducting plate 102.

In this case, it is also preferable to dispose the heat receiving unit 103 and the fins 301 included in the heat receiving unit 103 at the position facing the respective heating elements 101. That is to say, it is preferable to include a plurality of fin regions inside the heat receiving unit 103 that cools a plurality of heating elements 101. In this case, there is a region without the fin 301 disposed between neighboring fin regions, and there are the refrigerant in liquid state and the refrigerant in vapor state in the region. An absence of the fin 301 between the fin regions enables the liquid-phase refrigerant to be supplied smoothly. Additionally, the space in the container of the heat receiving unit 103 increases due to the presence of a region without the fin 301, which allows for securing a buffer space to be occupied by a vaporized refrigerant vapor. The presence of the buffer space makes it possible to suppress a pressure rise inside the container of the heat receiving unit 103 even though the container of the heat receiving unit 103 is filled with large quantities of refrigerant vapor arising from vaporization of the refrigerant. The pressure rise inside the container causes a rise of boiling point of the refrigerant, and the rise of boiling point produces a rise of cooling temperature; therefore, it is preferable to suppress the pressure rise inside the container in order to cool the heating element efficiently.

A Fourth Exemplary Embodiment

Figure 9:
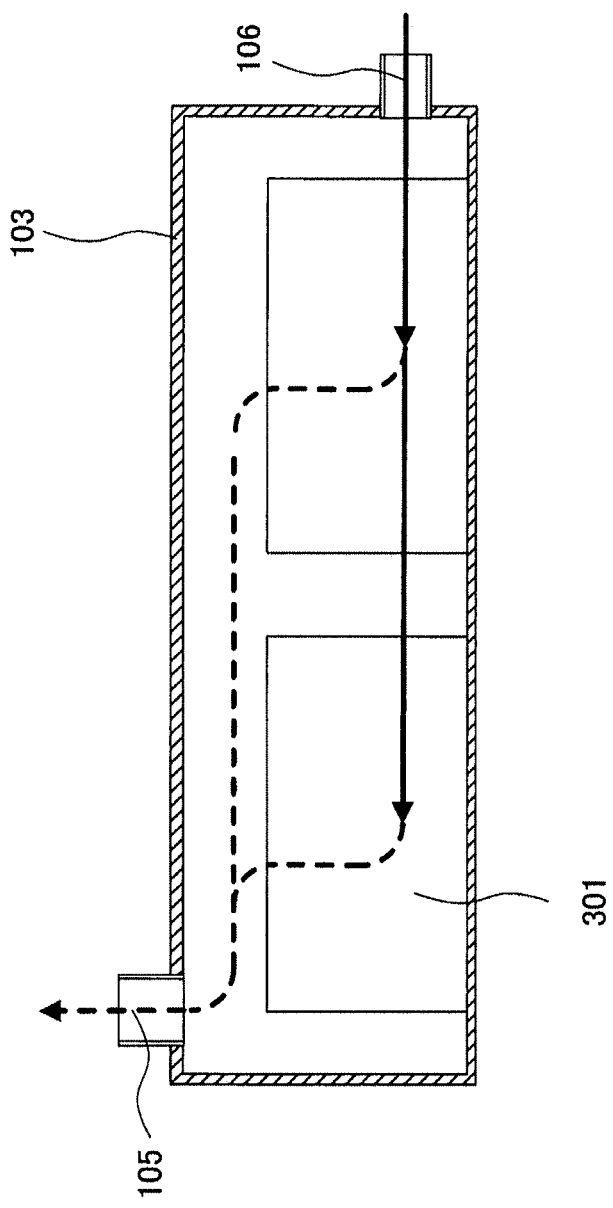
FIG. 9 is a cross-sectional view illustrating a configuration near to a heat receiving unit in a phase-change cooler in accordance with a fourth exemplary embodiment of the present invention.

Next, a fourth exemplary embodiment of the present invention will be described. FIG. 9 is a cross-sectional view illustrating a configuration near to a heat receiving unit 103 in a phase-change cooler in accordance with the fourth exemplary embodiment of the present invention.

A liquid pipe 106 and a vapor pipe 105 are connected to the heat receiving unit 103 included in the phase-change cooler in accordance with the present exemplary embodiment, the liquid pipe 106 into which a condensed and devolatilized refrigerant flowing back from a radiation unit flows, the vapor pipe 105 through which a vaporized refrigerant vapor is released into the radiation unit.

It is desirable for a diameter of the vapor pipe 105 (first connection) to be greater than a diameter of the liquid pipe 106 (second connection). The reason is as follows. When the entire phase-change cooler is in a steady state, a mass-based flow rate of the refrigerant is constant anywhere; however, a volume-based flow rate varies greatly. The reason is that the density of liquid differs greatly from that of gas. In addition, it allows for preventing the refrigerant vapor from mixing that the diameter of the liquid pipe through which the refrigerant flows toward the heat receiving unit is configured to be small. As a result, it is possible to form, without using a check valve, a refrigerant circulation system that is capable of preventing the refrigerant from flowing back, or even though a backflow occurs, of reducing the effect of the backflow to a minimum. If there is no possibility of backflow of the refrigerant, the diameter of the liquid pipe 106 can be equalized to the diameter of the vapor pipe 105, in which case the cooling effect increases because the fluidity of the liquid-phase refrigerant becomes higher.

The container of the heat receiving unit 103 includes a first junction connected to the vapor pipe 105 and a second junction connected to the liquid pipe 106. The first junction connected to the vapor pipe 105 can be disposed vertically above the second junction connected to the liquid pipe 106. The configuration makes it possible to prevent the backflow phenomenon that the refrigerant vapor flows out to the radiation unit through the liquid pipe 106. The liquid-phase refrigerant boils inside the heat receiving unit 103, and the refrigerant vapor arises. Since the generated refrigerant vapor has a smaller specific gravity than that of the liquid-phase refrigerant, it flows toward an outlet (first junction) that is disposed vertically above for the vapor pipe 105. As mentioned above, a space can be created between the upper end of the fin 301 disposed inside the heat receiving unit 103 and the upper surface of the container composing the heat receiving unit 103. The refrigerant vapor generated in the fin region flows toward the vapor pipe 105 through the space. It is preferable for the distance between the upper end of the fin 301 and the upper surface of the container composing the heat receiving unit 103 to be set ranging from approximately twice the interval between the fins to a similar distance to the height of the fin.

A Fifth Exemplary Embodiment

Figure 10:
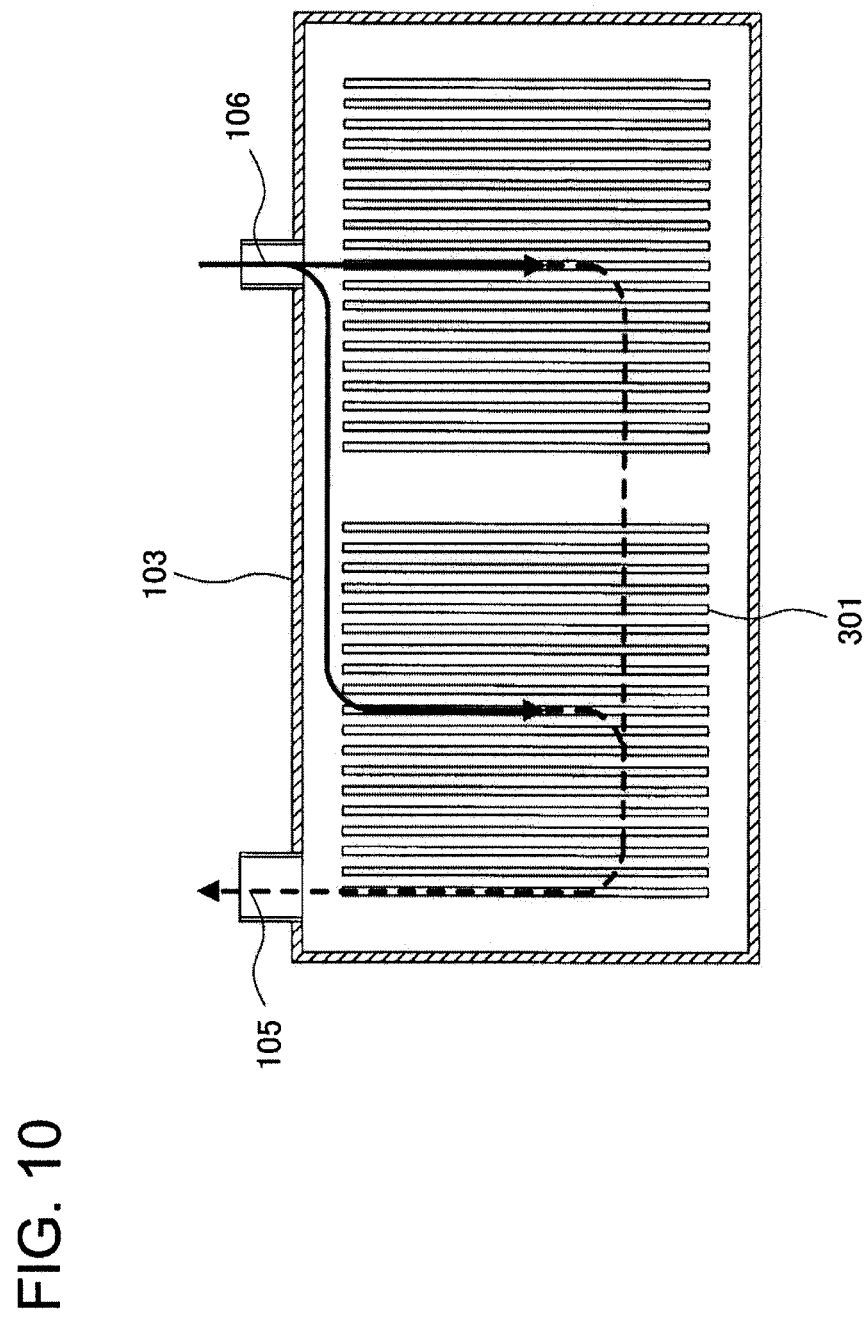
FIG. 10 is a top view illustrating a configuration near to a heat receiving unit in a phase-change cooler in accordance with a fifth exemplary embodiment of the present invention.

Next, a fifth exemplary embodiment of the present invention will be described. FIG. 10 is a top view illustrating a configuration near to a heat receiving unit 103 in a phase-change cooler in accordance with a fifth exemplary embodiment of the present invention.

In the heat receiving unit 103 included in the phase-change cooler in accordance with the present exemplary embodiment, a first junction connected to a vapor pipe 105 and a second junction connected to a liquid pipe 106 are respectively disposed on the same side of a container of the heat receiving unit 103. A fin 301 (projection portion) disposed on a bottom surface of the heat receiving unit 103 has a plate-like shape and extends almost parallel to the inflow direction of the liquid-phase refrigerant flowing into the second junction. In FIG. 10, a solid-line arrow and a dashed-line arrow represent a flow path of a liquid-phase refrigerant and a flow path of a vapor-phase refrigerant, respectively.

It is preferable for the liquid pipe 106 to be disposed near the center of a fin region placed inside the heat receiving unit 103. The liquid-phase refrigerant flowing into from the liquid pipe 106 flows in between the respective fins 301 through an interspace between the end of the fin region and the inner-wall surface of the container on which the liquid pipe 106 is disposed. At this time, it is preferable for a plurality of fin regions to be disposed side by side with each end facing the wall surface to which the liquid pipe 106 is connected. Here, the distance between the side surface of the container of the heat receiving unit 103 and the ends of the plurality of fins 301 can be larger than or equal to approximately twice and smaller than or equal to approximately ten-times the distance between the plurality of fins 301.

The liquid-phase refrigerant flowing in between the fins 301 vaporizes cooling the fins 301, and the vaporized vapor-phase refrigerant flows toward the vapor pipe 105 through a space above the fin regions. It is preferable for the vapor pipe 105 to be disposed near a different fin region from the fin region disposed near the liquid pipe 106. The liquid pipe 106 and the vapor pipe 105 are disposed separately, which makes it possible to cool the entire inside of the heat receiving unit 103 with the refrigerant flowing in one direction from the liquid pipe 106 toward the vapor pipe 105.

Figure 11:
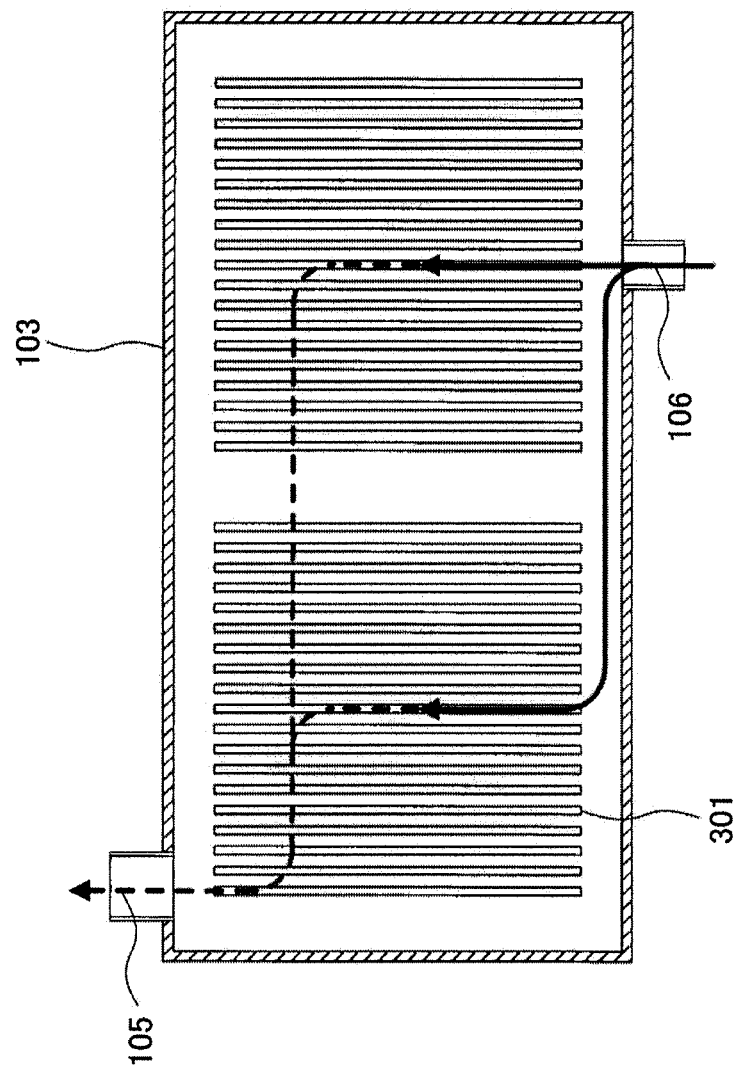
FIG. 11 is a top view illustrating another configuration near to the heat receiving unit in the phase-change cooler in accordance with the fifth exemplary embodiment of the present invention.

FIG. 11 illustrates another configuration near to the heat receiving unit 103 in the phase-change cooler in accordance with the present exemplary embodiment. In this case, in the heat receiving unit 103, the first junction connected to the vapor pipe 105 and the second junction connected to the liquid pipe 106 are respectively disposed on side surfaces of the container of the heat receiving unit 103 that face each other. It can be configured that the fin 301 (projection portion) has a plate-like shape and extends almost parallel to the inflow direction of the liquid-phase refrigerant flowing into the second junction.

The liquid-phase refrigerant flowing into from the liquid pipe 106 flows in between the respective fins 301 through an interspace between the end of the fin region and the inner-wall surface of the container on which the liquid pipe 106 is disposed. At this time, it is preferable for a plurality of fin regions to be disposed side by side with each end facing the wall surface to which the liquid pipe 106 is connected. The liquid-phase refrigerant flowing in between the fins 301 vaporizes cooling the fins 301, and the vaporized vapor-phase refrigerant flows toward the vapor pipe 105 through a space above the fin regions. It is preferable for the vapor pipe 105 to be disposed near a different fin region from the fin region disposed near the liquid pipe 106. The liquid pipe 106 and the vapor pipe 105 are disposed separately, which makes it possible to cool the entire inside of the heat receiving unit 103 with the refrigerant flowing in one direction from the liquid pipe 106 toward the vapor pipe 105.

In the exemplary embodiments illustrated in FIG. 10 and FIG. 11, the fin 301 is configured to extend almost parallel to the inflow direction of the liquid-phase refrigerant flowing into the second junction that is connected to the liquid pipe 106. However, the configuration is not limited to the above, as illustrated in FIG. 12, it may be configured that the fin 301 (projection portion) disposed on the bottom surface of the heat receiving unit 103 has a plate-like shape and extends almost perpendicular to the inflow direction of the liquid-phase refrigerant flowing into the second junction.

Figure 12:
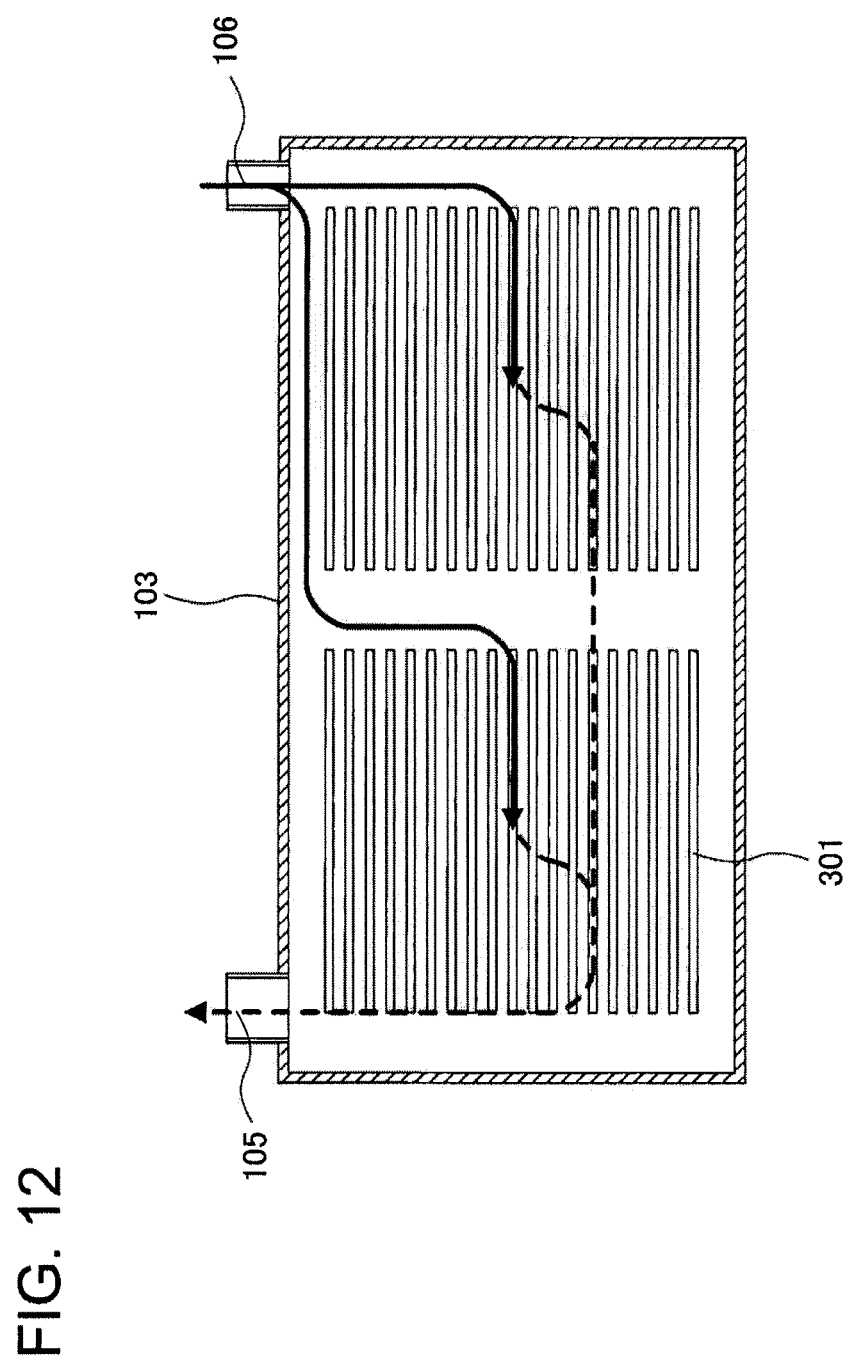
FIG. 12 is a top view illustrating yet another configuration near to the heat receiving unit in the phase-change cooler in accordance with the fifth exemplary embodiment of the present invention.

FIG. 12 illustrates a configuration in which the first junction connected to the vapor pipe 105 and the second junction connected to the liquid pipe 106 are respectively disposed on the same side of the container of the heat receiving unit 103. In this case, it is preferable for the junctions for the vapor pipe 105 and the liquid pipe 106 to be placed respectively near the both ends of the container of the heat receiving unit 103. The liquid-phase refrigerant flowing into the heat receiving unit 103 from the liquid pipe 106 flows in between the respective fins 301 through an interspace between the end of the fin region and the inner-wall surface of the container of the heat receiving unit 103. The liquid-phase refrigerant flows toward the fin region positioned distantly from the junction for the liquid pipe 106 through an interspace between the longitudinal side surface of the fin region and the inner-wall surface of the container of the heat receiving unit 103, which makes it possible to supply the liquid-phase refrigerant to a plurality of fin regions. The liquid-phase refrigerant flowing in between the fins 301 vaporizes cooling the fins 301, and the vaporized vapor-phase refrigerant flows toward the vapor pipe 105 through a space above the fin regions.

Figure 13:
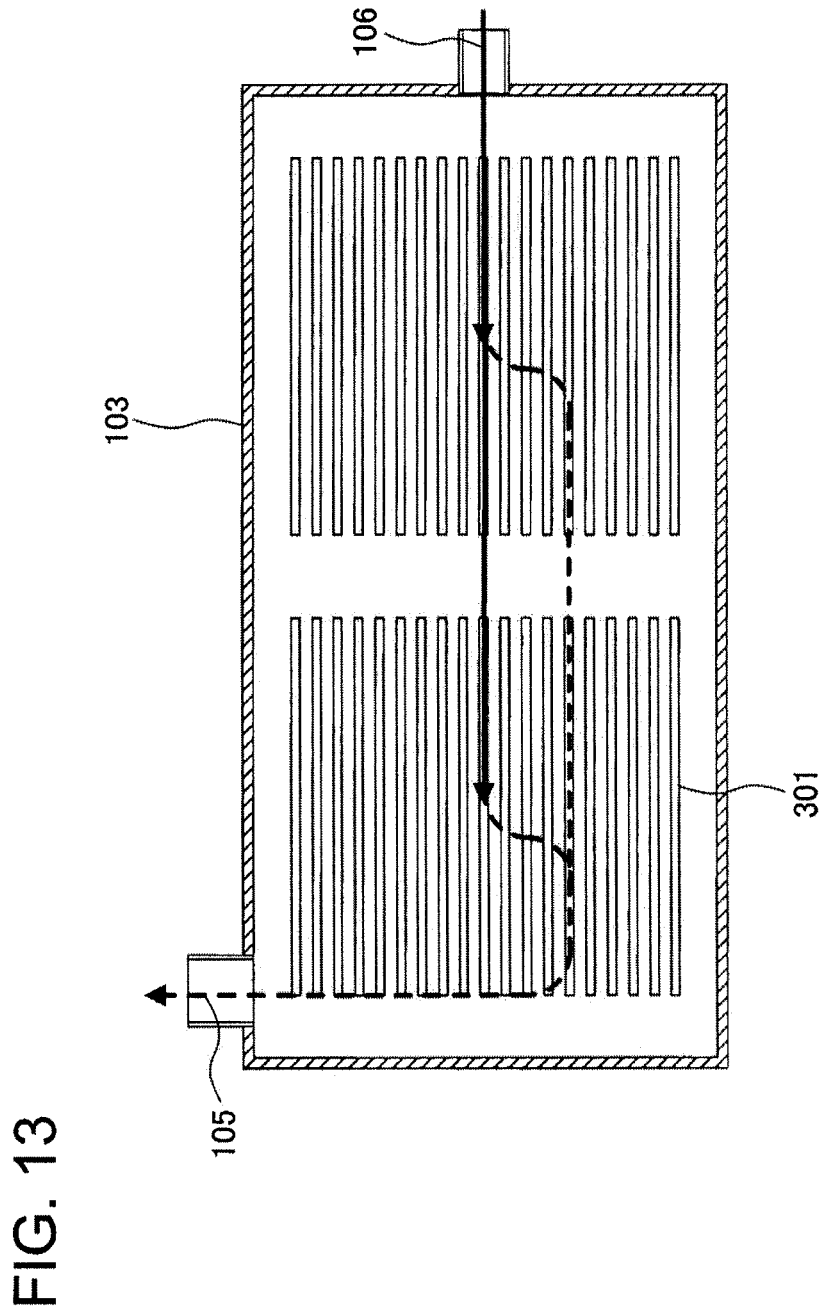
FIG. 13 is a top view illustrating yet another configuration near to the heat receiving unit in the phase-change cooler in accordance with the fifth exemplary embodiment of the present invention.

FIG. 13 illustrates a configuration in which the first junction connected to the vapor pipe 105 and the second junction connected to the liquid pipe 106 are respectively disposed on two side surfaces almost perpendicular mutually out of the side surfaces of the container of the heat receiving unit 103. That is to say, the vapor pipe 105 and the liquid pipe 106 are respectively disposed in directions almost perpendicular to one another. The fin 301 is configured to have a plate-like shape and extend almost parallel to the inflow direction of the liquid-phase refrigerant flowing into the second junction, which enables the liquid-phase refrigerant to flow into the fin region easily. It is preferable for the junction (second junction) connected to the liquid pipe 106 to be disposed near the center of the fin region. By being configured like that, the liquid-phase refrigerant flows toward the fin region positioned distantly from the junction for the liquid pipe 106 through an interspace between the longitudinal side surface of the fin region and the inner-wall surface of the container of the heat receiving unit 103, which makes it possible to supply the liquid-phase refrigerant to a plurality of fin regions.

The liquid-phase refrigerant flowing in between the fins 301 vaporizes cooling the fins 301, and the vaporized vapor-phase refrigerant flows toward the vapor pipe 105 through a space above the fin regions. Since the generated vapor-phase refrigerant flows toward the vapor pipe 105 through a space above the fins 301, the connection direction of the vapor pipe 105 may differ from the longitudinal direction of the fin region, as illustrated in FIG. 13.

It is preferable for the vapor pipe 105 to be disposed near a different fin region from the fin region disposed near the liquid pipe 106. The liquid pipe 106 and the vapor pipe 105 are disposed separately, which makes it possible to cool the entire inside of the heat receiving unit 103 with the refrigerant flowing in one direction from the liquid pipe 106 toward the vapor pipe 105.

The configurations have been described as examples in the above-mentioned second to fifth exemplary embodiments in which the first junction connected to the vapor pipe 105 is disposed on the side of the container of the heat receiving unit 103. However, they are not limited to this, the first junction connected to the vapor pipe 105 may be disposed on the upper surface of the container of the heat receiving unit 103. The reason is that the refrigerant vapor arising between the fins 301 flows toward the upper part of the fin region due to buoyancy. At this time, it is preferable for the distance between the upper end of the fin 301 and the upper surface of the container of the heat receiving unit 103 to range from approximately twice the length of the interval between the fins 301 to approximately twice the length of the height of the fin 301 so that the refrigerant vapor arising in a plurality of fin regions may accumulate.

The present invention has been described with reference to the above-mentioned exemplary embodiments as exemplary examples. However, the present invention is not limited to the above-mentioned exemplary embodiments. That is to say, the present invention can be applied to various aspects that can be understood by those skilled in the art without departing from the scope of the present invention.

This application is based upon and claims the benefit of priority from Japanese Patent Application No. 2014-063622, filed on Mar. 26, 2014, the disclosure of which is incorporated herein in its entirety by reference.

REFERENCE SIGNS LIST 10, 100 Phase-change cooler
11 Heat-conducting board
12, 103 Heat receiving unit
13, 104 Radiation unit
14 Connection
20 Cooling object
101 Heating element
102 Heat-conducting plate
105 Vapor pipe
106 Liquid pipe
107, 201 Fixing member
202 Heat-conducting member
203 Internal thread
204 Concave portion
301 Fin

The invention claimed is:
1. A phase-change cooler, comprising:
a heat-conducting board configured to be thermally connected to a plurality of objects to be cooled;
a heat receiving unit configured to store a refrigerant and receive heat of the plurality of objects to be cooled through the heat-conducting board;
a first fixing member configured to fix the heat receiving unit to the heat-conducting board;
a second fixing member configured to fix the plurality of objects to be cooled to the heat-conducting board;
a radiation unit configured to radiate heat, condensing and devolatilizing a vapor-phase refrigerant arising from vaporization of the refrigerant in the heat receiving unit; and
a connection configured to connect the heat receiving unit and the radiation unit, wherein
the heat receiving unit includes a container and a plurality of projection portions that are disposed on a heat receiving unit bottom surface of a bottom surface in an interior wall of the container in contact with the refrigerant,
the plurality of projection portions are disposed in a plurality of projection regions on the heat receiving unit bottom surface, and
each of the plurality of projection regions is centered at a position facing, across the heat-conducting board, each of the plurality of objects to be cooled.

2. The phase-change cooler according to claim 1, wherein the heat-conducting board includes a concave portion corresponding to a shape of at least one of the plurality of objects to be cooled on a surface facing the at least one of the plurality of objects to be cooled.

3. The phase-change cooler according to claim 2, wherein the heat-conducting board is no fewer than about three millimeters, nor more than about ten millimeters in thickness.

4. The phase-change cooler according to claim 1, wherein the heat-conducting board is no fewer than about three millimeters, nor more than about ten millimeters in thickness.

5. The phase-change cooler according to claim 1, wherein a distance between an upper end of the projection portion and an upper surface of the container is larger than or equal to twice a distance between the plurality of projection portions and smaller than or equal to twice a height of the projection portion.

6. The phase-change cooler according to claim 1, wherein the projection portion has a plate-like shape extending in one direction, and the plurality of projection portions are disposed in an array direction perpendicular to a longitudinal direction of the plate-like shape, and
the heat-conducting board is thermally connected to the plurality of objects to be cooled in an arrangement where a longitudinal direction of the plurality of objects to be cooled is parallel to an array direction.

7. The phase-change cooler according to claim 1, wherein the projection region is a region between lines making 45 degrees with a normal to the heat-conducting board.

8. The phase-change cooler according to claim 1, wherein the plurality of projection portions are disposed in a plurality of the projection regions, and a distance between the plurality of the projection regions is larger than or equal to a distance between the plurality of projection portions.

9. The phase-change cooler according to claim 1, wherein the connection includes a first connection configured to transport the vapor-phase refrigerant from the heat receiving unit to the radiation unit, and a second connection configured to transport a liquid-phase refrigerant condensed and devolatilized in the radiation unit from the radiation unit to the heat receiving unit,
the heat receiving unit includes a first junction configured to be connected to the first connection, and a second junction configured to be connected to the second connection, on a side of the container, and the first junction is disposed between an upper end of the projection portion and an upper surface of the container.

10. The phase-change cooler according to claim 9, wherein a diameter of the first connection is greater than a diameter of the second connection.

11. The phase-change cooler according to claim 9, wherein the first junction is disposed vertically above the second junction.

12. The phase-change cooler according to claim 9, wherein
the first junction and the second junction are respectively disposed on a same side of the container, and
the projection portion has a plate-like shape and extends parallel to an inflow direction of the liquid-phase refrigerant flowing into the second junction.

13. The phase-change cooler according claim 12, wherein a distance between a side surface of the container and ends of the plurality of projection portions is larger than or equal to twice and smaller than or equal to ten-times a distance between the plurality of projection portions.

14. The phase-change cooler claim 9, wherein
the first junction and the second junction are respectively disposed on side surfaces of the container that face each other, and
the projection portion has a plate-like shape and extends parallel to an inflow direction of the liquid-phase refrigerant flowing into the second junction.

15. The phase-change cooler according to claim 9, wherein
the first junction and the second junction are respectively disposed on a same side of the container, and
the projection portion has a plate-like shape and extends perpendicular to an inflow direction of the liquid-phase refrigerant flowing into the second junction.

16. The phase-change cooler according claim 9, wherein
the first junction and the second junction are respectively disposed on two side surfaces almost perpendicular mutually out of side surfaces of the container, and
the projection portion has a plate-like shape and extends parallel to an inflow direction of the liquid-phase refrigerant flowing into the second junction.

* * * * *